United States Patent [19]

Dugan et al.

[11] 4,141,782
[45] Feb. 27, 1979

[54] BUMP CIRCUITS ON TAPE UTILIZING CHEMICAL MILLING

[75] Inventors: William P. Dugan, Pomona; Eugene Phillips, Diamond Bar, both of Calif.

[73] Assignee: General Dynamics Corporation, Pomona, Calif.

[21] Appl. No.: 873,453

[22] Filed: Jan. 30, 1978

[51] Int. Cl.² .................... C23F 1/02; B29C 17/08; H01L 21/306; H01L 21/312

[52] U.S. Cl. ................ 156/643; 29/625; 96/36.2; 156/659; 156/661; 156/666; 156/668; 156/901

[58] Field of Search ............... 156/629–634, 156/643, 644, 646, 652, 656, 659, 666, 901, 902, 661; 96/36.2, 38.4; 29/577, 578, 591, 625, 620, 626; 357/70

[56] References Cited

U.S. PATENT DOCUMENTS

| | | |
|---|---|---|
| 3,816,198 | 6/1974 | LaCombe et al. .......... 156/643 |
| 4,052,787 | 10/1977 | Shaheen et al. .......... 156/634 X |
| 4,057,459 | 11/1977 | Mitterhummer et al. ...... 156/634 X |

*Primary Examiner*—William A. Powell

*Attorney, Agent, or Firm*—Henry M. Bissell; Edward B. Johnson

[57] ABSTRACT

Carriers forming strips for semiconductor integrated circuit chips. The carrier consists basically of a flexible tape, such as a polyimide. A conductive sheet, such as a copper sheet, is initially prepared to form a lead circuit on one surface and a bump circuit on the other. This metal sheet may be gold plated. Subsequently, a layer of polyimide is applied to the lead circuit side and both the polyimide sheet and the opposite bump circuit are covered with a metal sheet, such as copper. A photoresist layer is put over the copper and is suitably illuminated and developed to provide apertures through which the copper can be etched to expose the polyimide sheet. This takes place over the windows or openings adjacent the bumps for the application of a heat ram as well as for the sprocket holes used for precisely aligning the carrier with the to-be-associated semiconductor chips. Finally, openings may also be provided to separate adjacent carrier strips from each other. The exposed polyimide layer is now removed by chemical milling. Subsequently the previously applied outer copper sheets are removed as by etching.

11 Claims, 8 Drawing Figures

BUMP CIRCUITS ON TAPE UTILIZING CHEMICAL MILLING

BACKGROUND OF THE INVENTION

1. Field of the Invention

This invention relates generally to a process for preparing carriers for integrated circuit chips and the like and, particularly, relates to such a carrier including a flexible film base, such as a polyimide.

2. Description of the Prior Art

It is conventional practice to provide a polyimide tape, such as is known by the trademark Kapton obtainable from DuPont. In this connection, reference is made to the patents to Marley, Nos. 3,390,308, Aird, 3,689,991, Brummett et al., 3,937,857, and Hamlin, 3,968,563.

When using such a polyimide carrier, it is necessary to remove the polyimide layer surrounding the bumps of a bump circuit as well as the sprocket holes which are conventionally placed on both sides of a lead and bump circuit to provide precise registration with the semiconductor chips.

In accordance with the present invention, this is effected by a chemical milling process, not disclosed in these patents. Preferably the chemical milling is effected in a plasma reactor utilizing oxygen ($O_2$) and carbon tetrafluoride ($CF_4$), in the manner disclosed and claimed in the patent of Phillips, U.S. Pat. No. 4,012,307, assigned to the assignee of the present application.

Various processes for preparing such chip carriers have also been disclosed in the past. In this connection, reference is made to the patent to Galli et al., U.S. Pat. No. 3,781,596. FIG. 10 of this patent does refer to a process for preparing a bump circuit over a layer of polyimide. The bump circuit may then subsequently be provided with a layer of gold, aluminum, copper, or the like.

CROSS-REFERENCES TO RELATED APPLICATIONS

The present application is related to the copending application to Dugan entitled "Method of Making Circuitry With Bump Contacts", Ser. No. 873,460 assigned to the assignee of the present application, and filed concurrently herewith, and to the application to Dugan entitled "Isolated Bump Circuitry on Tape Utilizing Electroforming", Ser. No. 873,461 also filed concurrently herewith, and also assigned to the assignee of the present application.

SUMMARY OF THE INVENTION

The present invention utilizes the bump circuit preferably prepared in accordance with the teachings of the copending Dugan application Ser. No. 873,460, referred to above.

Accordingly, the process of the present invention starts with a previously formed metal sheet having a lead circuit on one side and a bump circuit on the opposite side. The metal sheet is preferably gold coated with an optional nickel layer between the original metal sheet, such as copper, and the gold layer.

In accordance with the present invention, the lead circuit is covered with a sheet of polyimide, which may, for example, consist of Kapton. Subsequently, a layer of copper is applied, both to the polyimide layer and to the bump circuit, completely covering the latter. The copper layers may either consist of adhesive copper sheets or they may be provided by electroless plating.

A layer of photoresist is now disposed over the copper sheet, covering the lead circuit. The photoresist is suitably illuminated through a mask and developed to remove the photoresist over those areas of the copper layer which are to be removed, for example, by etching. Thus, the areas not covered by gold plating and corresponding to sprocket holes, the windows surrounded by the bumps of the bump circuit, as well as a separation line for individual strips of the carrier, are now ready to be removed for etching. This in turn will expose the polyimide layer on the lead side while the bump side is still protected by a metal sheet.

The polyimide is now removed by chemical milling, preferably in accordance with the teachings of the Phillips patent, above referred to.

Now the two copper layers may by removed, for example, by etching. If necessary, the area of the sprocket holes may be removed, also by etching if this has not previously been effected, as well as the strip separation line, and the tape is ready for use.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing.

BRIEF DESCRIPTION OF THE DRAWING

FIGS. 1-4 are a series of fragmentary, sectional views corresponding to the successive process steps in the preparation of a carrier as disclosed and claimed in the Dugan application Ser. No. 873,460, above referred to.

DESCRIPTION OF THE PREFERRED EMBODIMENTS

Figure 1:
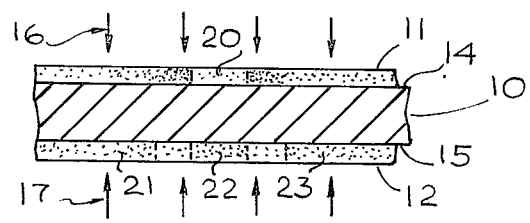

Referring now to the drawing, there is illustrated in FIGS. 1-4 the preferred process for preparing a carrier for semiconductor devices. FIG. 5 is an extended view. The carrier consists of an electrically conductive metallic sheet 10 which may, for example consist of copper and which may have a thickness of three mils. The sheet 10 may be a copper panel having a size of 6" × 9". As shown in FIG. 1, both surfaces of the copper sheet are covered with a layer of photoresist as shown at 11 and 12. It may be assumed that the top surface 14 of the copper sheet 10 will eventually represent the lead circuit; that is, the circuit which makes contact to the external terminals for the semiconductor chip. The other surface 15 represents the bump circuit comprising raised pads or bumps which in turn are intended to make contact with the conductive terminals of the semiconductor device.

Figure 2:
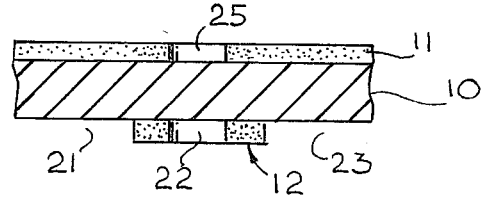

The photoresist layer 11 is now illuminated with light as indicated by the arrows 16 through a suitable mask to form the lead circuit. Similarly, the photoresist 12 is also illuminated by light as shown by arrows 17 through another suitable mask to form the bump circuit. The photoresist layers 11 and 12 are now developed to bare those areas of the sheet 10 which are to be removed by etching. Thus, the portion 20 of the photoresist layer 11 is to be removed as shown by dotted lines 20, as are the areas 21, 22 and 23 of the photoresist layer 15 to form a bump circuit. The resulting structure is illustrated in FIG. 2. Here the photoresist layer 11 is provided with an island 25 through which an opening is to be made through the copper sheet 10. Similarly, the photoresist layer 12 has been removed as shown at 21, 22 and 23 to form the bump circuit.

A chemical etchant is now applied to the surface 14 of the copper sheet 25 which forms the lead circuit. The chemical etchant, may for example, consist of ferric chloride in solution. Eventually the etching solution will dissolve the copper sheet along the island 25 to form an aperture 28 (see FIG. 3). This opening or aperture 28 is formed adjacent the bumps to be formed and serves the purpose of permitting a heat ram applied from the lead circuit side, represented by surface 14, to reach an underlying semiconductor structure. It will, of course, be realized that the original copper sheet 10 is continuous and what is shown in FIG. 3 is only a partial sectional view.

Eventually, after the etching solution has dissolved the copper sheet 10, it will run to the bump surface 15 of the copper sheet and eat away a portion of the original copper sheet 10 as shown at 30 and 31. This will leave the bumps 32 as high as the original sheet of copper. In other words, the bumps (assuming a sheet three mils thick) have the same height. On the other hand, only about one mil of the copper is removed from the lead portions 30 and 31. Therefore, the lead portions still have a height of say, two mils, while the bumps 32 have a height of three mils and a diameter of three to five mils.

The thickness of the lead portion of say two mils is sufficient to prevent the leads from breaking under lead pull tests or in actual service.

Figure 3:
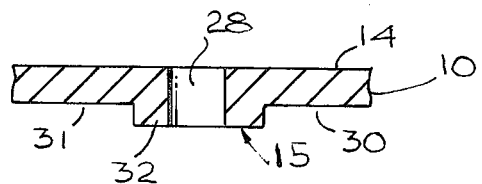

The structure shown in FIG. 3 is now additionally polished. This may be effected by another etching solution for copper, such as ammonium persulfate. This etching step may be carried out for approximately 15 or 20 minutes. In any case, the etching is continued until half a mil of the copper is removed. This, of course, results in a reduction of the bump diameter of one mil. At the same time, this etching process does not materially reduce the thickness of the lead circuit which is still between one mil and 1.5 mil in thickness. The main purpose of this etching or polishing step is to reduce the diameter of the bump circuit 32, which is initially made larger than the desired final size. Also, the polishing will remove the rough edges of the bumps. The final diameter of the bump is such as to match the dimension of the chip contact pad which is generally about four mils square.

Figure 4:
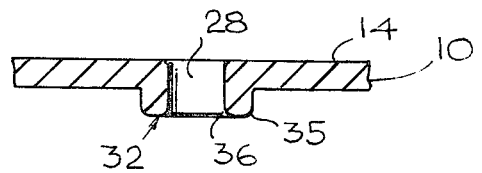
Figure 5:
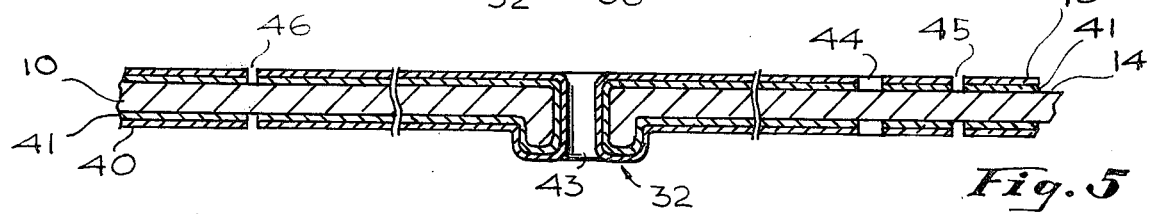
FIGS. 5-8 are a series of extended fragmentary, sectional views, including a sprocket hole and line separations between adjacent carrier strips, corresponding to the successive process steps in the preparation of a carrier for use with semiconductor devices, or circuit chips in accordance with the present invention.

FIG. 4 shows the result of the polishing step where the lead circuit surface 14 and the aperture 28 remain substantially unchanged. On the other hand, the edges 35 and 36 of each bump 32 have been rounded or polished as illustrated.

Alternatively, and preferably, the carrier structure of FIG. 3 may be polished by electropolishing. In this case, the structure of FIG. 3 may be placed in a suitable electrolytic bath. The carrier is oriented in such a manner that the bumps 32 face the anode of the bath circuit. In such a bath, the electric current tends to concentrate at the sharp edges. Therefore, a selective etching takes place at the edges 35, 36 of the bumps 32 to round off the sharp edges. This procedure again will reduce the diameter of the bumps as explained hereinbefore.

It should be noted that electropolishing of the type disclosed herein is well known in the art. It has been described, for example, in the patents to Dobbin et al., U.S. Pat. No. 3,314,869, the patent to Gwyn, Jr., 3,519,543 and in the patent to Ono et al., 3,719,567.

The structure of FIG. 4 is now gold plated with a gold layer 40 (see FIG. 5). Preferably before the gold plating is effected, a layer of nickel 41 is first disposed on the carrier of FIG. 4, for example, by flashing.

It should be noted that the particular etching process as explained in connection with FIGS. 2 and 3, by applying the etching solution only on the lead circuit surface of the structure, makes it possible to create bumps having a relatively small size. In the past, it has been very difficult to control the diameter of the bumps where conventional chemical etching takes place simultaneously from both sides. Furthermore, as indicated before, the conventional etching step tends to develop leads having a thickness of between one-half to one mil. Such leads are generally too thin and tend to break either in actual service or during pull tests.

The polishing step explained in connection with FIG. 4 permits a rather precise control of the diameter of the bumps and also tends to remove sharp corners.

The structure of FIG. 5, which illustrates an extended sectional view, now provides a window 43 surrounding the bumps 32. The window 43 makes is possible to apply a heat ram from the lead side to thermobond the bumps to the circuit chip. Also shown in the structure of FIG. 5 are apertures 44 through the gold and nickel plating to bare the original copper layer 10 for the purpose of providing sprocket holes. It will be realized that the sprocket holes may be made in the same manner as the windows 43 during the previously described process. Alternatively, they may be made subsequently as will be described hereinafter.

The gold layer 40 and, where present, the nickel layer 41 may also be interrupted as shown at 45 and 46. This will again bare the original copper sheet 10 so that it may be etched to provide for line separation for individual carrier strips which may be made from the original copper panel.

In accordance with the present invention, the bump circuit 14 is now covered with a layer of polyimide 50. As pointed out before, the polyimide may, by way of example, consist of Kapton.

Subsequently, the polyimide layer 50 is covered by a suitable copper sheet or layer 51. Similarly, the bump circuit 15 is also covered by a copper layer 52. The copper layer 52 serves the purpose of protecting the polyimide sheet 50 during the subsequent chemical milling step. Both copper layers 51 and 52 may, for example, each consist of an adhesive sheet of copper. Alternatively, the copper layers 51 and 52 may be formed by electroless plating with copper.

Figure 6:
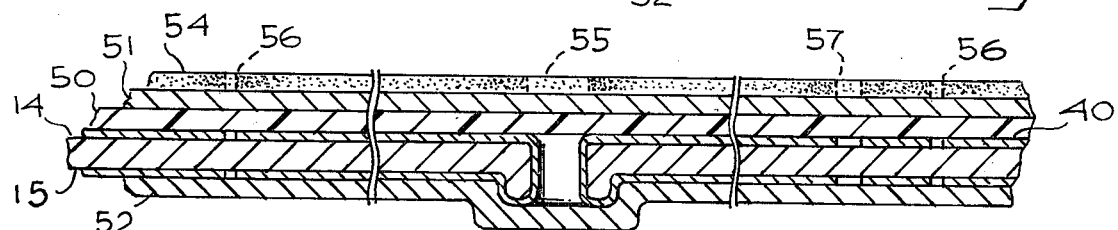

Now, as also shown in FIG. 6, the copper sheet 51 is covered with a layer 54 of photoresist. The photoresist is again illuminated through a suitable mask so that the illuminated photoresist portions may be removed by a chemical developing step. As shown by dotted lines, a relatively large opening 55 is made to expose the window 43, as well as a somewhat larger area. Similarly, as shown at 56, the photoresist is to be removed to provide for the separation lines for individual carrier strips. Finally as shown at 57, the photoresist is to be removed to provide for the sprocket holes unless this has already been effected during the previous method steps.

Figure 7:
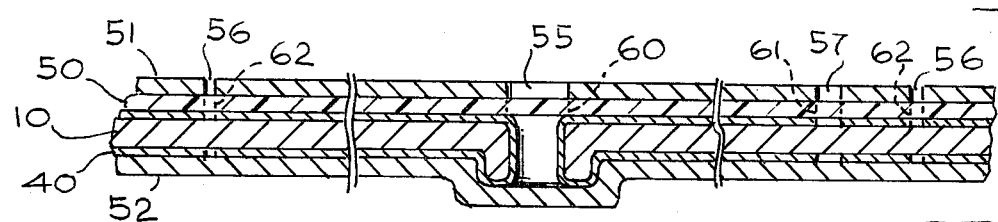
Figure 8:
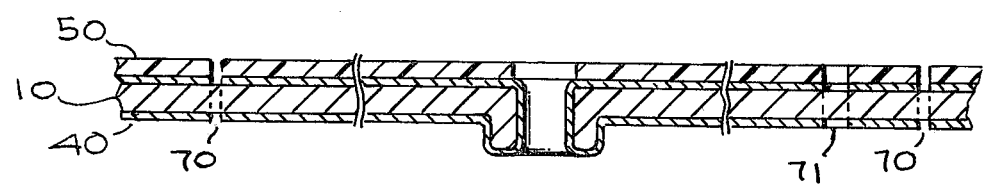

It should be noted that in FIGS. 6–8, for the sake of clarity, only the gold layer 40 has been illustrated and not the intermediate middle layer 41.

As shown in FIG. 7, the photoresist 54 is now provided with openings 55 for a window central of the bump circuit 15, openings 56 for the line separation for individual carrier strips, and openings 57 for the sprocket holes.

The structure of FIG. 7 is now ready for the chemical milling step. This may be effected in the plasma reactor as disclosed and claimed in the Phillips patent, referred to above. The reaction takes place in a plasma generated from oxygen ($O_2$) and carbon tetrafluoride ($CF_4$). It is presently believed that the active materials which carry out the etching consist of atomic fluorine (F), and an oxyfluorine radical (OF). In any case, by means of this chemical etching step, the polyimide layer is removed where it is exposed by the photoresist and not protected by the metal layer 52. This has been illustrated by dotted line 60 for the window, dotted line 61 for the sprocket holes, and dotted line 62 for the separation line for the carrier strips.

The remaining layer of photoresist 54 may either be separately removed after the chemical milling step or may also be removed by the chemical milling step. In the latter case, the photoresist should consist of a material which is subject to chemical milling.

After the photoresist 54 has been removed, it is now possible to remove the copper sheet 50 which covered the lead circuit, and the copper sheet 52 which covered the bump circuit by chemical etching. The only purpose of the copper sheet 52 was to protect the Kapton from the chemical milling process, which of course, acts on all sides of the circuit.

At the same time, that is during removal by etching of the copper sheets 51 and 52, the original copper sheet 10 may be etched through the gold plating 40 to provide the line separation 70 as well as the sprocket holes 71, unless they have previously been prepared as explained before.

It will now be realized that the entire structure, as illustrated in FIG. 8, is mounted on a flexible polyimide sheet, and is ready for use. The entire panel may be easily separated along the separation lines, such as 70, into individual carrier strips. It should also be noted that the gold plating will protect the bump and lead circuits from the chemical etching which must take place.

There has thus been disclosed an improved process for the manufacture of bump circuits on a plastic, flexible tape. The process is characterized by the chemical milling of the flexible tape, which preferably consists of a polyimide. The actual bump circuit is made as disclosed and claimed in the above-mentioned Dugan application Ser. No. 873,460. The process of the invention makes it possible to manufacture simultaneously a large copper panel, which may have a size of 6" × 9". The gold plated panel may eventually be separated into individual strips, each being provided with sprocket holes for precise registration with a lead circuit on one surface, a bump circuit on the opposite surface, and a window for a heat ram for the application of heat for thermal bonding the circuitry to integrated circuit chips.

What is claimed is:

1. A process for the manufacture of a flexible carrier for use with semiconductor integrated circuit chips and for making connections thereto, said carrier comprising a copper sheet having a lead circuit on one surface thereof and a bump circuit on its opposite side, the copper sheet being gold plated except for desired openings, said process comprising the following steps:
   (a) applying a sheet of a polyimide over the lead side of the carrier;
   (b) applying respective layers of copper to both sides of the carrier;
   (c) applying a layer of a photoresist to the lead side only;
   (d) illuminating the photoresist layer through a mask to provide desired openings representing sprocket holes, line separations between adjacent strips, and openings surrounding the bumps in the bump circuit;
   (e) developing the photoresist to remove the unexposed photoresist;
   (f) chemically milling through the exposed copper, thereby to remove the polyimide; and
   (g) removing both layers of copper.

2. A process as defined in claim 1 wherein the exposed polyimide layer is removed by etching it in a plasma with oxygen and carbon tetrafluoride.

3. A process as defined in claim 1 including the additional step of etching the carrier where exposed by the gold plating to provide sprocket holes.

4. A process as defined in claim 1 including the additional step of etching the carrier where exposed by the gold plating through the line separation between adjacent strips.

5. A process as defined in claim 1 wherein the copper layers are applied to both sides of the carrier by means of adhesive copper sheets.

6. A process as defined in claim 1 wherein the copper layers are applied to both sides of the carrier by electroless plating with copper.

7. A process as defined in claim 1 including the additional step of removing the remaining photoresist after chemically milling the polyimide.

8. A process as defined in claim 1 wherein the remaining photoresist is removed by chemical milling together with the exposed polyimide.

9. A process for the manufacture of a flexible carrier for use with semiconductor integrated circuit chips and for making connections thereto, said carrier comprising an electrically conductive metal sheet having a lead circuit on one surface thereof, and a bump circuit on its opposite side, the conductive sheet being plated with a metal resistant to a chemical etchant for the conductive sheet, the plating not extending to desired openings, said process comprising the following steps:
   (a) applying a sheet of a polyimide over the lead side of the conductive metal sheet;
   (b) applying an additional layer of a conductive metal to both the lead circuit and the bump circuit;
   (c) applying a layer of a photoresist to the lead side only;
   (d) illuminating the photoresist layer through a mask to provide desired openings;
   (e) developing the photoresist to remove the unexposed photoresist;
   (f) chemically milling the exposed polyimide, thereby to remove it; and
   (g) removing both layers of the conductive, metal layers.

10. A process as defined in claim 9 wherein the remaining photoresist is removed by chemical milling along with the exposed polyimide.

11. A process as defined in claim 9 wherein the remaining photoresist is removed after the chemical milling step.

* * * * *